United States Patent [19]

Sakano

[11] Patent Number: 4,884,226

[45] Date of Patent: Nov. 28, 1989

[54] METHOD FOR DETECTING POSITION

[75] Inventor: Tetsuro Sakano, Yamanashi, Japan

[73] Assignee: Fanuc Ltd., Yamanashi, Japan

[21] Appl. No.: 262,081

[22] Filed: Oct. 24, 1988

Related U.S. Application Data

[63] Continuation of Ser. No. 887,162, Jul. 3, 1986, abandoned.

[30] Foreign Application Priority Data

Nov. 5, 1984 [JP] Japan ................. 59-231354

[51] Int. Cl.$^4$ .................. H03K 13/08; G06F 15/20
[52] U.S. Cl. ......................... 364/560; 364/559; 324/165; 341/112
[58] Field of Search ........... 364/560, 559, 603, 817, 364/449; 340/347 P, 347 SY, 870.25; 318/608; 324/165, 78 D, 175; 328/133; 250/231 SE

[56] References Cited

U.S. PATENT DOCUMENTS

| | | | |
|---|---|---|---|
| 4,099,245 | 7/1978 | Maysonett | 364/603 |
| 4,119,958 | 10/1978 | Simon et al. | 340/347 SY |
| 4,335,443 | 6/1982 | Dickey | 340/347 SY |
| 4,390,865 | 6/1983 | Lauro | 364/603 |
| 4,449,117 | 5/1984 | Fortescue | 340/347 SY |
| 4,476,420 | 10/1984 | Asakawa | 318/608 |
| 4,583,079 | 4/1986 | Simon | 340/347 SY |
| 4,587,485 | 5/1986 | Papierwik | 324/175 |

FOREIGN PATENT DOCUMENTS 59-12764 1/1984 Japan .

Primary Examiner—Parshotam S. Lall
Assistant Examiner—Ellis B. Ramirez
Attorney, Agent, or Firm—Armstrong, Nikaido, Marmelstein, Kubovcik & Murray

[57] ABSTRACT

A method is provided for detecting a position, comprising the steps of: producing two-phase sinusoidal wave signals having a 90°-spatial phase difference therebetween upon movement of a moving object; detecting the current voltage $V_a$ and $V_b$ of the two-phase sinusoidal wave signals and calculating a value of $\alpha$ making a value of V zero, given by $V = V_a \cdot \cos\alpha - V_b \cdot \sin\alpha$; determining the value of $\alpha$ so that polarities of $\sin\alpha$ and $\cos\alpha$ for the calculated $\alpha$ coincide with those of $V_a$ and $V_b$, respectively; and detecting a moving position of the moving object by using the value of $\alpha$ determined in the preceding step as absolute position data within 1 cycle of the 2-phase signals. According to the above method for detecting a position, the absolute position of a moving object can be detected with a high resolution.

5 Claims, 7 Drawing Sheets

→ ROTATION IN ONE DIRECTION

→ ROTATION IN OPPOSITE DIRECTION

METHOD FOR DETECTING POSITION

This application is a continuation of application Ser. No. 887,162 filed July 3, 1986 now abandoned.

TECHNICAL FIELD

The present invention relates to a method for detecting a position and, more particularly, to a method of accurately detecting a moving position of a working machine (e.g., an NC machine) or of the arms of a robot.

BACKGROUND ART

Position detection is conventionally performed by using two-phase sinusoidal wave signals (referred to as signals $V_a$ and $V_b$ hereinafter) having a 90°-spatial phase difference therebetween, and a position detecting apparatus of this type is generally called an encoder.

A conventional encoder irradiates light emitted from, e.g., a light-emitting diode, to a rotary encoding plate (normally provided with a large number of slits (e.g., 2,000) at equal intervals on the periphery thereof) mounted on a given rotating shaft, whose rotating position is to be detected. The light passed through a slit formed in the rotary encoding plate and a slit formed in a fixed plate facing the rotary encoding plate is received by a light-receiving element (e.g., a photodiode) to be converted into a voltage, thereby obtaining, in accordance with rotation of the rotary encoding plate, sinusoidal wave signals $V_a$ and $V_b$, one cycle of which corresponds to an interval between two adjacent slits (one pitch) formed in the rotary encoding plate.

In this case, in order to provide the 90°-spatial phase difference between the two sinusoidal wave signals $V_a$ and $V_b$, two slits, shifted by ¼ of a pitch from an integer multiple of the slit interval (1 pitch) of the rotary encoding plate, are formed in the fixed slit plate, and the two sinusoidal wave signals $V_a$ and $V_b$ are obtained from the electrical signals generated in the light-receiving elements, each of which faces each of the above two slits (see FIG. 1(a)).

The sinusoidal wave signals $V_a$ and $V_b$, are input to comparators for generating output signals AP and BP, which go to a HIGH or a LOW level in accordance with positive or negative levels of the sinusoidal wave signals. A so-called positive pulse for sequentially counting up an up-down counter (meaning that the rotary encoding plate is rotated in a given direction, e.g., clockwise) is produced in the following states: when the output signal BP is at a HIGH level at the leading edge of the output signal AP; when the output signal AP is at a HIGH level at the trailing edge of the output signal BP; when the output signal BP is at a LOW level at the trailing edge of the output signal AP; and when the output signal AP is at a LOW level at the leading edge of the output signal BP (see FIG. 1(b)). On the other hand, a so-called negative pulse for sequentially counting down the up-down counter (meaning that the rotary encoding plate is rotated in the opposite direction, e.g., counterclockwise) is produced in the following states: when the output signal BP is at a LOW level at the 1 - edge of the output signal AP; when the output signal AP is at a LOW level at the trailing edge of the output signal BP; when the output signal BP is at a HIGH level at the trailing edge of the output signal AP; and when the output signal AP is at a HIGH level at the leading edge of the output signal BP (see FIG. 1(c)). In this manner, the rotational angle of the rotary encoding plate, i.e., a rotating position of the rotating shaft on which the rotary encoding plate is mounted, is detected (in some cases, the rotational angle of the rotary encoding plate is linearly developed, and the moving position of a linearly moving object is detected).

However, in this conventional position detecting method, only four pulses (the positive or negative pulses) for counting up or down the up-down counter are generated upon rotation of the rotary encoding plate during 1 cycle of the output signal AP or BP (corresponding to a 1-pitch interval of two adjacent slits in the rotary encoding plate), as described above. If 2,000 slits are formed in the periphery of the rotary encoding plate, the resolution of the rotational angle detection is only $1/(2,000 \times 4) = 1/8,000$ rotation. In other words, upon rotation of the rotary encoding plate, only a detection resolution corresponding to 4 times of a divisor for each rotation of the rotary encoding plate, corresponding to the number of slits, can be obtained.

DISCLOSURE OF THE INVENTION

The present invention has been made in consideration of the above situation, and its object is to detect an absolute position of a rotating member or, in general, a moving object within 1 cycle of the sinusoidal wave with a remarkably high detection resolution (e.g., $1/(2,000 \times 1,000)$ rotation) when compared with that obtained in the above-mentioned conventional moving position detecting method.

Another object of the present invention is to detect absolute position over a plurality of cycles of a sinusoidal wave of a short wavelength and to detect absolute position over a single rotation of a rotary plate with high resolution, by using a plurality of pairs of two-phase sinusoidal wave signals each of which pairs has a different wavelength from each other.

In order to solve the above problem, according to an aspect of the present invention, there is provided a method for detecting a position, comprising the steps of: producing two-phase sinusoidal wave signals having a 90°-spatial phase difference therebetween upon movement of a moving object; detecting the current voltage values $V_a$ and $V_b$ of the two-phase sinusoidal wave signals and calculating a value of $\alpha$ making a value of V zero, given by $V = V_a \cdot \cos\alpha - V_b \cdot \sin\alpha$; determining the value of $\alpha$ so that polarities of $\sin\alpha$ and $\cos\alpha$ for the calculated $\alpha$ coincide with those of $V_a$ and $V_b$, respectively; and detecting a moving position of the moving object by using the value of $\alpha$ determined in the preceding step as absolute position data within 1 cycle of the 2-phase signals.

According to another aspect of the present invention there is provided a method for detecting a position, comprising the steps of: producing a plurality of pairs of two-phase sinusoidal wave signals having a 90°-spatial phase difference therebetween upon movement of a moving object, and each of which pairs has a different wavelength from each other; detecting the current voltage values $V_a$ and $V_b$ of one of said pairs of the two-phase sinusoidal wave signals and calculating a value of $\alpha$ making a value of V zero, given by $V = V_a \cdot \cos\alpha - V_b \cdot \sin\alpha$; determining the value of $\alpha$ so that polarities of $\sin\alpha$ and $\cos\alpha$ for the calculated $\alpha$ coincide with those of $V_a$ and $V_b$, respectively; detecting the current voltage values $V_c$ and $V_d$ of another pair of the two-phase sinusoidal wave signals and calculating value of $\beta$ making a value of V zero, given by $V = V_c \cdot \cos\beta - V_d \cdot \sin\beta$;

determining the value of $\beta$ so that polarities of $\sin\beta$ and $\cos\beta$ for the calculated $\beta$ coincide with those of $V_c$ and $V_d$, respectively; and detecting a moving position of a moving object by obtaining absolute position data over a plurality of cycles of the two-phase signals of the short wavelength from the values of $\alpha$, $\beta$, ... determined as per the preceding steps.

According to one aspect of the present invention, the value of $\alpha$ making the value of V zero, given by V $=V_a\cdot\cos\alpha-V_b\sin\alpha$ *is calculated by using:*
$V_a=V_0\sin\theta$, and $V_b=V_0\sin\theta$ (where $\theta$ is a current rotational angle).

As a result, the value of $\alpha$ making the value V given by the following equation zero need only be calculated:

$$V = V_0(\sin\theta \cdot \cos\alpha - \cos\theta \cdot \sin\alpha)$$
$$= V_0 \cdot \sin(\theta - \alpha)$$

In this case, the above equation becomes zero when $\alpha=\theta\pm n\pi$ where n is an integer).

Next, the calculated $\alpha$ is determined so that the polarities of $\sin\alpha$ and $\cos\alpha$ for the calculated $\alpha$ coincide with those of $V_a$ and $V_b$, respectively (under the condition: $0\leq\theta<2\pi$ radian), and thus, the determined $\alpha$ can act as absolute position data within 1 cycle of the sinusoidal waves.

According to another aspect of the present invention, by using a plurality of pairs of two-phase sinusoidal wave signals, each of which pairs has a different wavelength from each other, absolute position data over a plurality of cycles of the short-wavelength two-phase sinusoidal wave signals can be obtained based on the absolute position data within 1 cycle of each pair of two-phase sinusoidal wave signals, and thus, an absolute rotating position over a single rotation of a rotary object can also be detected.

In this case, the value of $\alpha$ making the value of V zero satisfies the above relation of $\alpha=\theta\pm n\pi$, regardless of the value of $V_O$, *which makes a major cause of detection errors (the value of $V_O$ varies during one rotation of the rotary plate* since a gap between the rotary encoding plate and the fixed slit plate varies upon rotation of the rotary encoding plate, and also varies due to a variation over time in the amount of light emitted from the light-emitting diode). As a result, 1 cycle of the sinusoidal wave signals (corresponding to a 1-pitch interval of the slits in the rotary encoding plate) is linearly interpolated and divided (i.e., equally divided) by a predetermined interpolating divisor (e.g., 1,000) by using the value of $\alpha$, thereby detecting absolute position data for the rotary encoding plate (generally, a moving object) with high resolution.

BEST MODE FOR CARRYING OUT THE INVENTION

Figure 2:
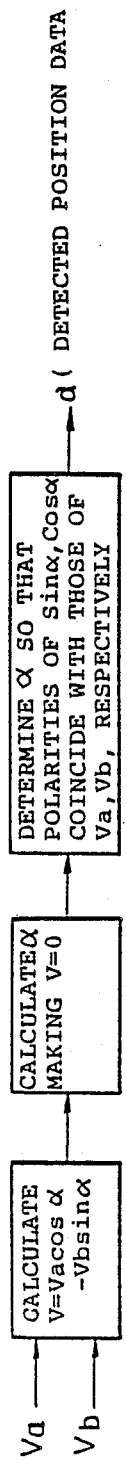
FIG. 2 is a block diagram showing a basic principle of a position detecting method according to the present invention.
Figure 3:
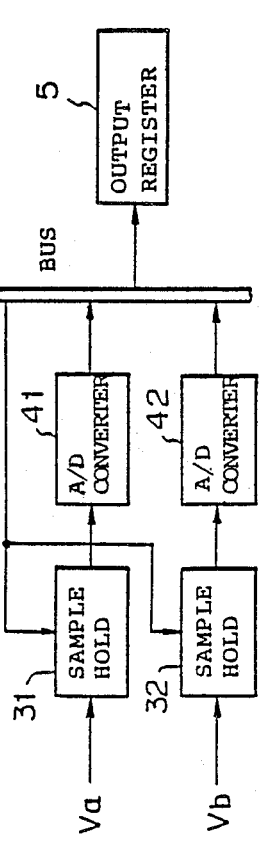
FIGS. 3 and 4 are block diagrams of detecting devices when the position detecting method according to a first aspect of the present invention is carried out.

FIG. 2 is a block diagram showing a basic principle of a position detecting method according to an aspect of the present invention, and FIGS. 2 and 3 are block diagrams of detecting devices when the position detecting method is carried out by using a computer.

According to the position detecting method of the present invention, voltage values $V_a$ and $V_b$ of two-phase sinusoidal wave signals, which are generated in accordance with the rotational angle of a rotary encoding plate (generally, the moving position of a moving object) as described in the background art, are retrieved at each of constant time interval (e.g., 50 msec), and are used to calculate $\alpha$, which makes a value V given by the following equation zero:

$$V=V_a\cdot\cos\alpha-V_b\cdot\sin\alpha$$

As will be described later, the obtained $\alpha$ is position data (in this case, data representing the rotational angle) obtained by linearly interpolating and dividing (equally dividing) 1 cycle of the sinusoidal waves (corresponding to an interval between two adjacent slits on the rotary encoding plate) in accordance with a predetermined divisor, and has the relation $\alpha=\theta\pm n\pi$(where n=0, 1, 2, ..., and $\theta$ is the rotational angle of the rotary encoding plate).

In this case, since $\alpha$ can be any of infinite values and its absolute value cannot be uniquely determined for each of values which are shifted by $\pi$ from each other, $\alpha$ is determined so that the polarities of $\sin\alpha$ and $\cos\alpha$ for the calculated $\alpha$ coincide with those of $V_a$ and $V_b$, respectively. In this case, however, there is a condition that is $0\leq\theta<2\pi$ (radians).

Figure 1:
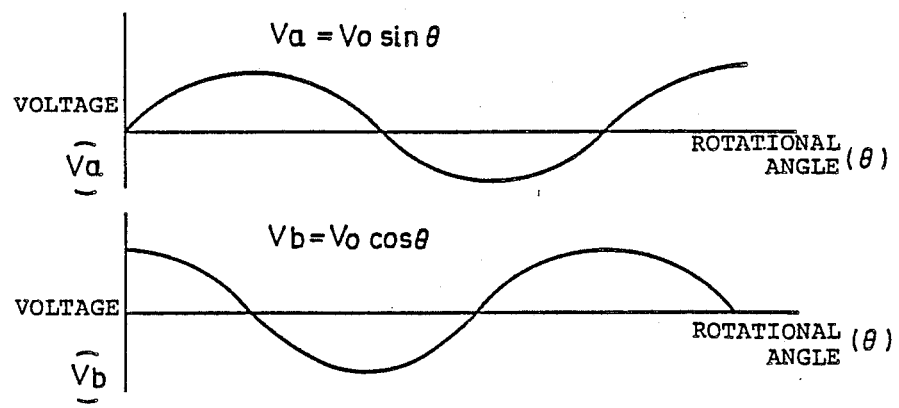
FIGS. 1(a), 1(b):, and 1(c) are waveform charts for explaining a conventional position detecting method.
Figure 1:
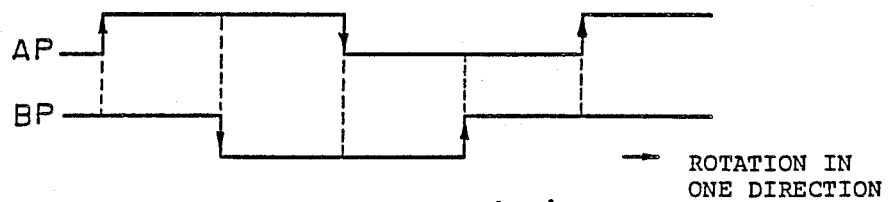
Figure 1:
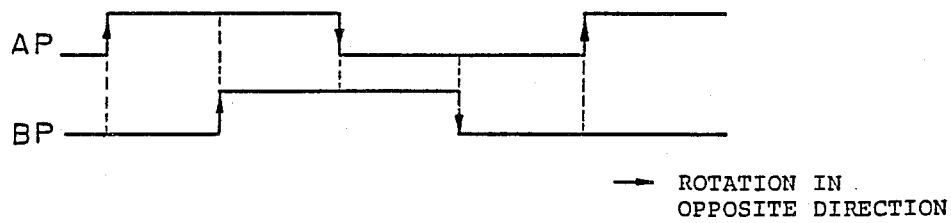

More specifically, if both $V_a$ and $V_b$ have a positive polarity, $\alpha$ must correspond to an angle within the first quadrant, and if they have a negative polarity, $\alpha$ must correspond to an angle within the third quadrant shifted from the first quadrant by $\pi$ (FIG. 1(a)).

If $V_a$ is positive and $V_b$ is negative, $\alpha$ must correspond to an angle within the second quadrant and if $V_a$ is negative and $V_b$ is positive, a must correspond to an angle within the fourth quadrant, shifted from the second quadrant by $\pi$ (also FIG. 1(a)).

Thus, the determined $\alpha$ acts as position data representing an absolute position within 1 cycle of the two-phase signals.

The reason why $\alpha$ making the value V given by V $=V_a\cdot\cos\alpha-V_b\cdot\sin\alpha$ zero, becomes equal to $(\theta\pm n\pi)$ will be explained below.

In the above equation:

$$V=V_a\cdot\cos\alpha-V_b\cdot\sin\alpha\ldots \quad (1)$$

since
$V_a=V_0\sin\theta$, $V_b=v_0\cos\theta$ (where $V_O$ is the amplitude of the two-phase sinusoidal wave signals, and $\theta$ is the rotating position (rotational angle) of the rotary encoding plate), when these equations are substituted in equation (1), $$V = V_0(\sin\theta \cdot \cos\alpha - \cos\theta \cdot \sin\alpha)$$
$$= V_0 \cdot \sin(\theta - \alpha).$$

Then, the value of $\alpha$ making the value of $V$ zero is:

$\alpha = \theta \pm n\pi$ (where n is an integer).

Figure 4:
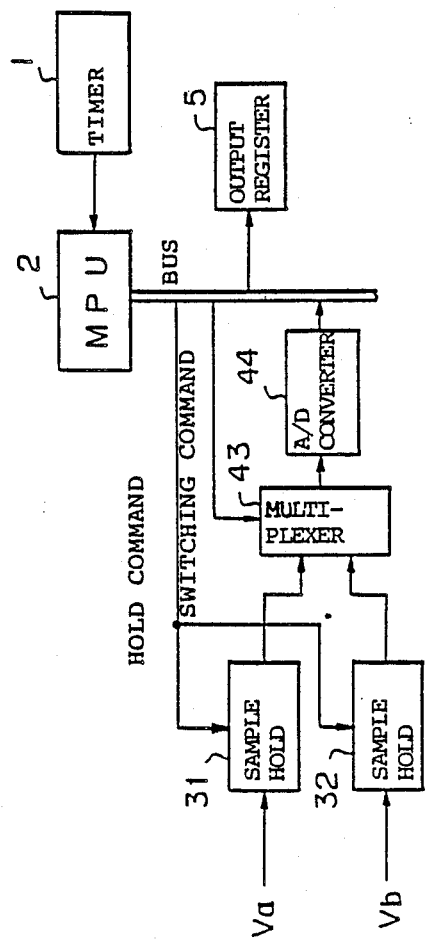

FIGS. 3 and 4 exemplify arrangements of detecting device when the position detecting method of the present invention is carried out by using the computer. In a detecting device shown in FIG. 3, a microprocessor 2 in the computer supplies, in response to timing signals generated by a timer 1 at predetermined intervals, a hold command to sample-hold circuits 31 and 32 (which respectively receive the sinusoidal wave signals $Va$ and $Vb$) so as to sample and hold the current value of the sinusoidal wave signals $V_a$ and $V_b$. During this interval, the analog values of the sinusoidal wave signals $Va$ and $Vb$ are converted into digital values by A/D converters 41 and 42, respectively, with a predetermined precision, and the digital values are input to the microprocessor 2 with each given cycle, through a bus.

In the microprocessor 2, these digital inputs are used as the values of $Va$ and $Vb$ in equation (1), and the value of $\alpha$ making equation (1), i.e., the value of $V$ zero, is then calculated at each cycle. Note that the calculation results for the respective cycles, i.e., position data $\alpha$ for the respective cycles can be sequentially stored in the memory of the computer or in an external output register 5.

In an apparatus shown in FIG. 4, instead of the two A/D converters 41 and 42 in FIG. 3, the outputs sampled and held by the sample-hold circuits 31 and 32 are sequentially input to a common A/D converter 44 by switching a multiplexer 43 in response to a switching command input thereto from the microprocessor 2 during each cycle, and the outputs from the converter 44 are sequentially input to the microprocessor 2, thus allowing omission of one A/D converter.

Practical methods for calculating the value of $\alpha$ making the value of $V$ given by equation (1) zero in the microprocessor 2 will now be described.

A first method is a so-called feedback method, in which $\alpha$ for each detection cycle is calculated by the following operation.

When position data $\alpha_i$ in a certain detection cycle is to be obtained, $V_i = V_a \cdot \cos\alpha_{i-1} - V_b \cdot \sin\alpha_{i-1}$ is calculated based on position data $\alpha_{i-1}$ obtained at immediately preceding cycle and the digital values $V_a$ and $V_b$ newly input from the A/D converters 41 and 42 or the converter 44, as described previously, and new position data $\alpha_i$ is calculated as follows on the basis of the value of $V_i$ (so-called proportional compensation method):

$\alpha_i = \alpha_{i-1} + KV_i$ (where K is a constant)  ...(2)

Alternatively, instead of using equation (2), the values of $V_i$ are accumulated to obtain $S_i$ (i.e., $$S_i = S_{i-1} + V_i = \sum_{n=0}^{i} V_n), \text{ and new}$$

position data $\alpha_i$ is calculated based on the $V_i$ and $S_i$ as follows (so-called proportional integral compensation method):

$\alpha_i = \alpha_{i-1} + K_p \cdot V_i + K_s \cdot S_i$  ...(3)

(where Kp and Ks are constants, and normally, $K_p > K_s$)

Note that although the proportional compensation method can be easily realized, when $\theta$ changes at a constant rate, a detection error proportional to the changing rate of $\theta$ inevitably occurs. On the other hand, although the proportional integral compensation method requires a complicated circuit, unlike the former, no detection error proportional to the changing rate of $\theta$ will occur.

In a second method, non-linear formula $V_a \cdot \cos\alpha - V_b \cdot \sin\alpha = 0$ associated with $\alpha$ is solved by the Newton's method. In this case, if $$V(\alpha) = V_a \cos\alpha - V_b \sin\alpha,$$

a differentiated value $V'(\alpha)$ for $\alpha$ is given by:

$$V'(\alpha) = -V_a \sin\alpha - V_b \cos\alpha.$$

Therefore, an approximate solution of the non-linear formula can be calculated by repeating the following procedure.

When position data $\alpha_i$ of a certain detection cycle is to be obtained, the position data $\alpha_{i-1}$ of the immediately preceding cycle is used as a initial approximate value of $\alpha_i$ (it is defined that $\alpha_{i-1}$ is equal to $\alpha_{i0}$, as $\alpha_{i0}$ corresponds to 0th approximation of $\alpha_i$), thus calculating:

$$\alpha_{i1} = \alpha_{i0} + \Delta\alpha_{ai0}$$

where $$\Delta\alpha_{i0} = -V(\alpha_{i0})/V'(\alpha_{i0})$$
$$= (V_a \cdot \cos\alpha_{i0} - V_b \cdot \sin\alpha_{i0})/$$
$$(V_a \cdot \sin\alpha_{i0} + V_b \cdot \cos\alpha_{i0}).$$

Then, $\alpha_{i1}$ is used as a first approximation of $\alpha_i$.

This operation is repeated, and if the nth approximation is $\alpha_{in}$, the (n+1)th approximation is given by:

$$\alpha_{i \cdot (n+1)} = \alpha_{in} + \Delta\alpha_{in} \, (n = 0, 1, 2 \ldots)$$

where $$\Delta\alpha_{in} = -V(\alpha_{in})/V'(\alpha_{in})$$
$$= (V_a \cdot \cos\alpha_{in} - V_b \cdot \sin\alpha_{in})/$$
$$(V_a \cdot \sin\alpha_{in} + V_b \cdot \cos\alpha_{in}).$$

Then, when an absolute value $|\Delta\alpha_{in}|$ of $\Delta\alpha_{in}$ satisfies $|\Delta\alpha_{in}| < \epsilon$ (where $\epsilon$ is a predetermined small value corresponding to a required precision), the repetition is stopped, and the position data $\alpha_i$ in that detection cycle is given by the approximate solution $\alpha_{i \cdot (n+1)}$.

Figure 7:
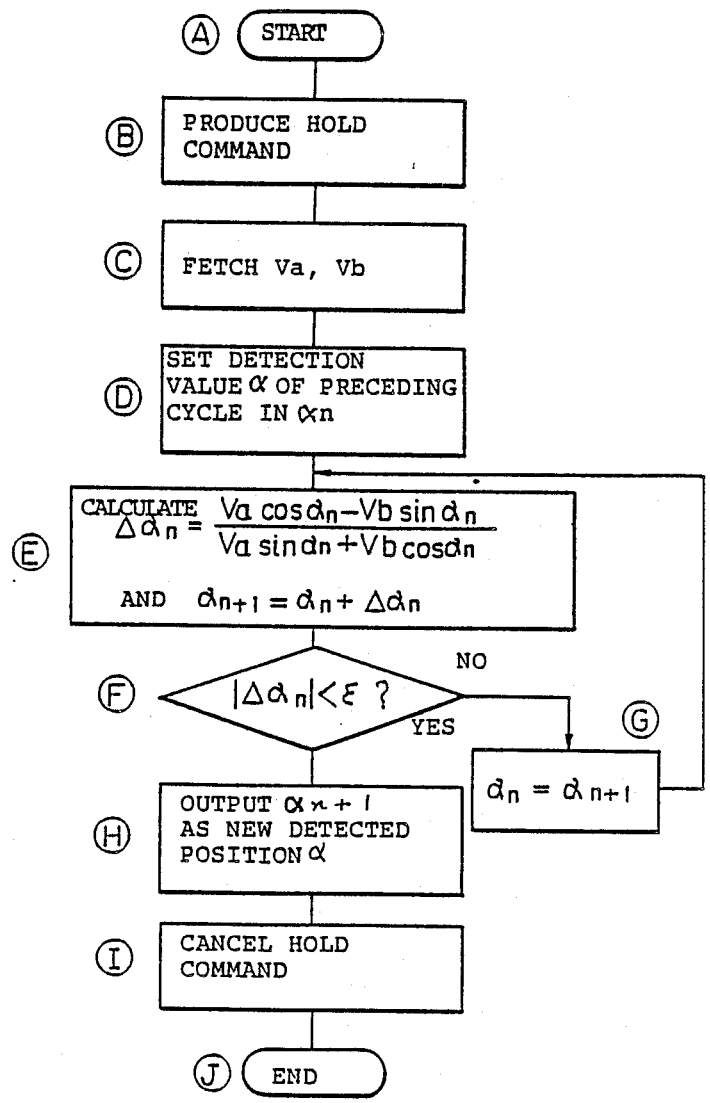
FIG. 7 is a flow chart of an example of a control program when detection position data is calculated by means of a computer with the method of the present invention.

FIG. 7 is a flow chart showing when the microprocessor 2 performs operation processing with the above Newton's method. Timing signals are generated from the timer 1 at equal intervals, and the microprocessor 2 initiates the next processing in response to each timing signal.

After the flow starts in step A, the microprocessor 2 produces the hold command to the sample-hold circuits 31 and 32 in step B, thus sampling and holding the current values of the sinusoidal wave signals $V_a$ and $V_b$ at that timing. The current analog values $V_a$ and $V_b$ are converted into the digital values of given precision by the A/D converters. 41 and 42, and the digital values $V_a$ and $V_b$ are retrieved in step C.

In step D, the detection value of the immediately preceding cycle (position data $\alpha_{i-1}$) is derived and is used as $\alpha i0$.

In step E, the following calculations are performed:

$$\Delta\alpha_n = (V_a \cdot \cos\alpha_n - V_b \cdot \sin\alpha_n)/(V_a \cdot \sin\alpha_n + V_b \cdot \cos\alpha_n)$$

and $$\alpha_{n+1} = \alpha_n + \Delta\alpha_n$$

(where n =0, 1, 2, ..., and at the beginning of calculation, n=0).

Next, it is determined in step F whether or not $|\Delta\alpha_n|$ is smaller than $\epsilon$ (where $\epsilon$ is a value for defining detection precision, and is given in advance). If NO is determined in step F, new $\alpha_n$ is given by $\alpha_{n+1}$ (step G), and the same calculation is repeated. However, if $|\Delta\alpha_n|$ is smaller than $\epsilon$, $\alpha_{n+1}$ is output as new detection position data $\alpha_i$ for that cycle in step H, and the hold command is cancelled in step I, thus completing operation processing for that cycle (step J).

With the method of the present invention, since the value of $\alpha$ making the value of V zero will not be adversely influenced by the amplitude $V_0$ of the two-phase sinusoidal wave signals, a major cause of detection errors, an error due to the amplitude $V_0$ will not occur. Also, since the voltage values $V_a$ and $V_b$ of the sinusoidal wave signals can be fetched by an A/D converter of predetermined bits with high precision, high-precision position data obtained by linearly interpolating and dividing 1 cycle of the sinusoidal waves (corresponding to a pitch between two adjacent slits on the rotary encoding plate) by a predetermined divisor (e.g., 1,000) in accordance with the number of bits of the A/D converter, can be detected accurately.

After the value of $\alpha$ making the value of V zero is obtained as described above, if the value of $\alpha$ is determined so that the polarities of $\sin\alpha$ and $\cos\alpha$ for he above a coincide with those of $V_a$ and $V_b$, respectively, the determined value of $\alpha$ represents the absolute detection position within 1 cycle of the two-phase signals, as previously described.

Figure 9A:
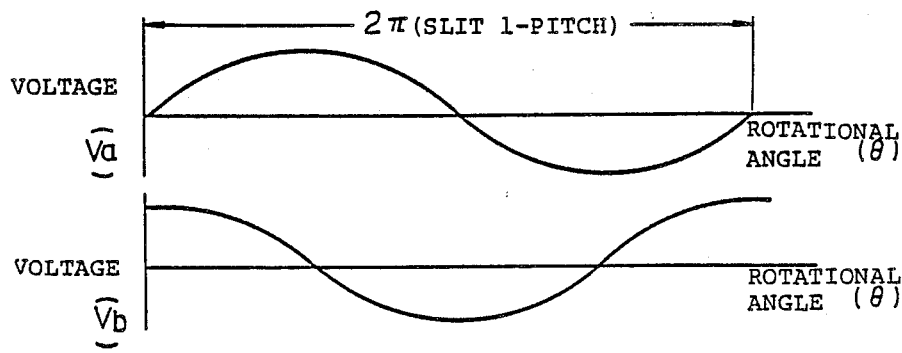
FIGS. 9(a) and 9(b) are waveform charts for explaining the second aspect of the present invention.
Figure 9B:
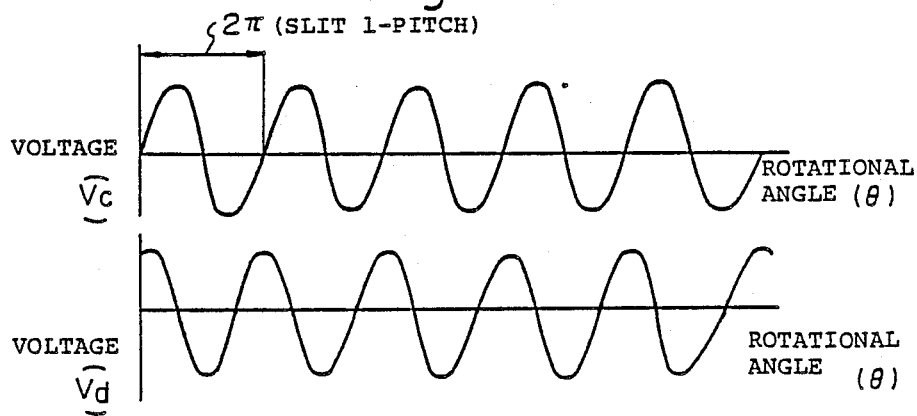

According to one aspect of the present invention as described above, the absolute position within 1 cycle of the sinusoidal waves (within 1 pitch corresponding to an interval between two adjacent slits on the rotary encoding plate) can be determined. Further, by developing the above idea, according to another aspect of the present invention, the absolute position over a plurality of cycles of short-wavelength two-phase signals $V_c$ and $V_d$ can be detected by using a combination of two-phase signals $V_c$ and $V_d$, whose cycle length is short (i.e., short wavelength), as shown in FIG. 9(b), and two-phase signals $V_a$ and $V_b$, whose cycle length is long (i.e., long wavelength), as shown in FIG. 9(a), and by combining the absolute position within 1 cycle of the long-wavelength two-phase signals $V_a$ and $V_b$, and the absolute position within 1 cycle of the short-wavelength two-phase signals $V_c$ and $V_d$.

More specifically, when the absolute position within 1 cycle of the long-wavelength signals is detected, it is possible to determine how many cycles of the short-wavelength signals exist between the 1-cycle start position of the long-wavelength signals and the detected position. Thereafter, the absolute position over a plurality of cycles of the short-wavelength signals can be detected by using the above determined cycle data and the absolute position data within 1 cycle of the short-wavelength signals.

Similarly, if two-phase signals having a longer wavelength than that of the long-wavelength signals are prepared, an absolute position over a plurality of cycles of the long-wavelength signal can be detected. Thus, the absolute position over a single rotation of a rotating object can also be detected with high resolution.

Figure 5:
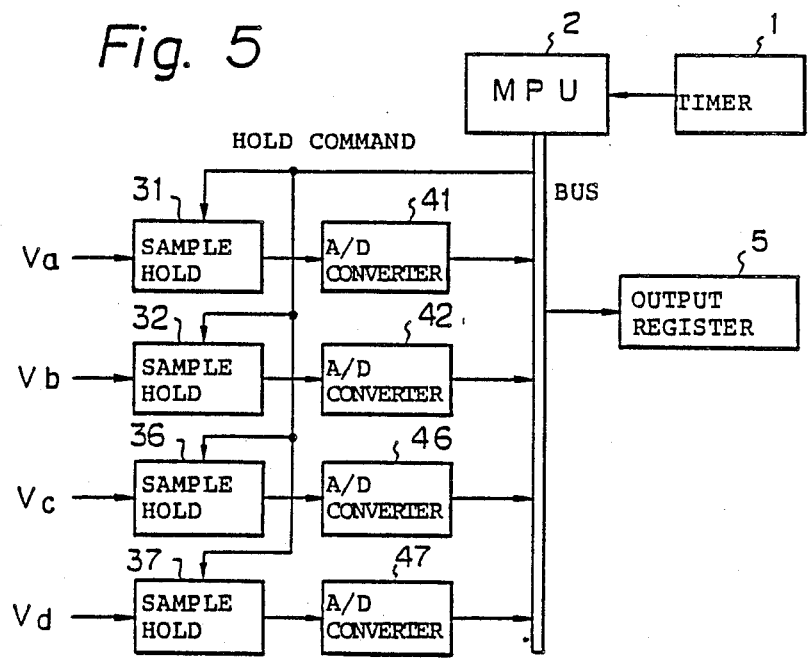
FIGS. 5 and 6 are block diagrams of detection devices when the position detecting method according to a second aspect of the present invention is carried out.
Figure 6:
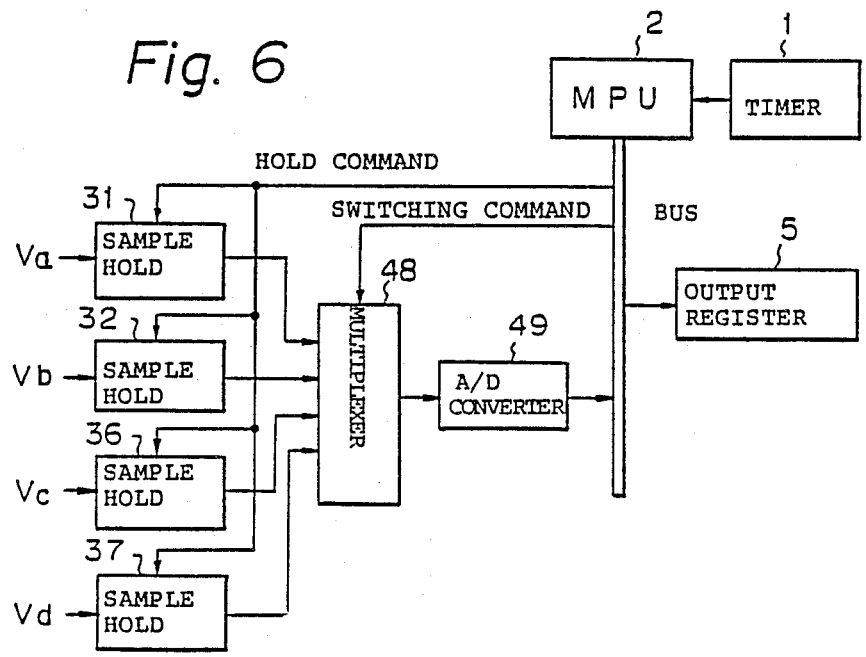

FIGS. 5 and 6 exemplify arrangements of detecting devices when position detection is performed by using two pairs of two-phase sinusoidal wave signals, each of which pairs has different wavelength from each other. In the device shown in FIG. 5, two-phase sinusoidal wave signals $V_a$ and $V_b$ are input to sample-hold circuits 31 and 32, and another two-phase sinusoidal wave signals $V_c$ and $V_d$ having a shorter wavelength than that of the sinusoidal wave signals $V_a$ and $V_b$ (e.g., having a wavelength 1/5 that of the signals $V_a$ and $V_b$, as shown in FIG. 9) are input to another pair of sample-hold circuits 36 and 37. While the values of the sinusoidal wave signals $V_a$, $V_b$, $V_c$, and $V_d$ are sampled and held in response to a hold command from a microprocessor 2, the analog values of the respective sinusoidal wave signals are converted into digital values with given precision by A/D converters 41, 42, 46, and 47, and these values are input to the microprocessor 2 with each given cycle defined by a timer 1 through a bus.

Then, on the basis of these digital inputs, a value of $\alpha$ making $V_1$ given by the following equation zero:

$$V_1 = V_a\cos\alpha - V_b\sin\alpha$$

and a value of $\beta$ making $V_2$ given by the following equation zero:

$$V_2 = V_c\cos\beta - V_d\sin\beta$$

are calculated. In addition, $\alpha$ is determined so that the polarities of $\sin\alpha$ and $\cos\alpha$ for the calculated $\alpha$ coincide with those of $V_a$ and $V_b$ (which can be detected based on the inputs from the A/D converters 41 and 42), respectively.

Also, $\beta$ is determined so that the polarities of $\sin\beta$ and $\cos\beta$ for the calculated $\beta$ coincide with those of $V_c$ and $V_d$ (which can be detected based on the inputs from the A/D converters 46 and 47), respectively.

Thus, absolute position data over a plurality of cycles of the short-wavelength two-phase signals is obtained on the basis of the determined $\alpha$ and $\beta$.

In the device shown in FIG. 6, instead of using the four A/D converters 41, 42, 46, and 47, the outputs sampled and held by the sample-hold circuits 31, 32, 36, and 37 are sequentially input to a common A/D converter 49 by switching a multiplexer 48 in response to a switching command input thereto from the microprocessor 2 during each cycle, and the outputs from the converter 49 are sequentially input to the microprocessor 2, thus allowing use of a single A/D converter.

Figure 8:
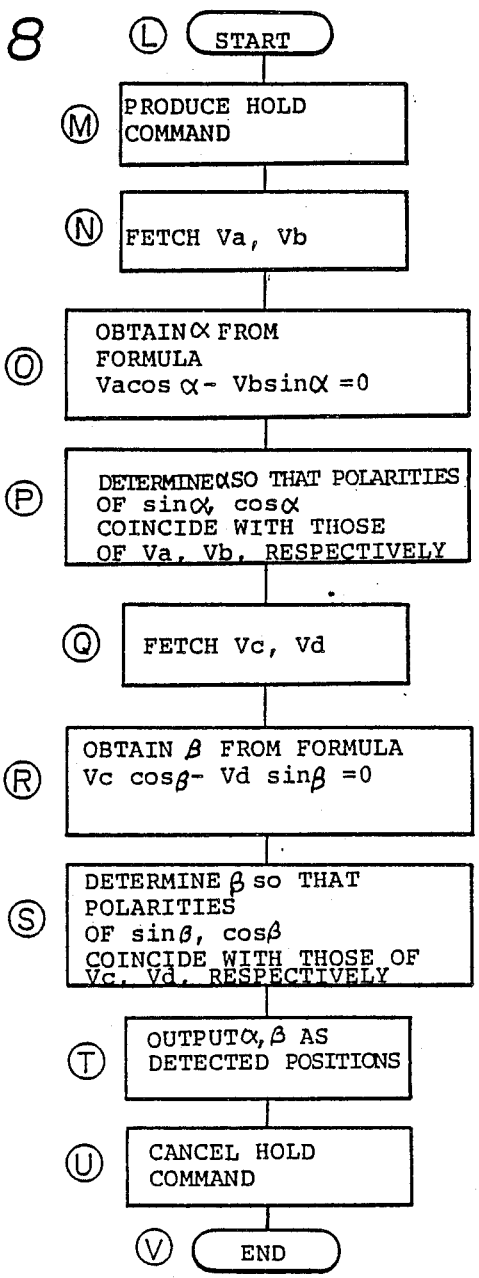
FIG. 8 is a flow chart of an example of a control program when detection position data is calculated by means of a computer by using the device shown in FIG. 5 or 6 with the method of the present invention.

FIG. 8 is a flow chart when $\alpha$ and $\beta$ are determined by using a microprocessor 2 on the basis of the above $V_a$, $V_b$, $V_c$, and $V_d$ input at each cycle. The timer 1 generates a timing signal at given intervals, and the microprocessor 2 initiates the next processing in response to each timing signal.

After the flow starts in step L, the microprocessor 2 supplies the hold command to the sample-hold circuits 31, 32, 36, and 37 in step M to sample and hold the current values of $V_a$, $V_b$, $V_c$, and $V_d$ at that timing. During this interval, these values (analog values) are supplied to the A/D converters 41 and 42 so as to be converted into the digital values with a given precision, and the digital values $V_a$ and $V_b$ are retrieved in step N. In step 0, $\alpha$ making the value $V_1$ given by $V_1 = V_a \cos\alpha - V_b \sin\alpha$ zero, is calculated (the calculation method has been described previously), and in step P, $\alpha$ is determined so that the polarities of $\sin\alpha$ and $\cos\alpha$ for the calculated $\alpha$ coincide with those of $V_a$ and $V_b$, respectively.

In step Q, the digital values $V_c$ and $V_d$ input through the A/D converters 46 and 47 are retrieved, and in step R, 8 making the value $V_2$ given by $V_2 = V_c \cos\beta - V_d \sin\beta$ zero, is calculated. In step S, $\beta$ is determined so that the polarities of $\sin\beta$ and $\cos\beta$ for the calculated $\beta$ coincide with those of $V_c$ and $V_d$, respectively.

When the $\alpha$ and $\beta$ determined in the above manner are output in step T, the absolute position data over a plurality of cycles of the short-wavelength two-phase signals can thereby be obtained. In step U, the hold command is canceled.

A case will be described wherein a rotary encoding plate in which a plurality of channels corresponding to a plurality of pairs of two-phase sinusoidal wave signals are provided, each of which pairs has a different wavelength from each other, is used as a means for generating the above plurality of pairs of two-phase sinusoidal wave signals according to one embodiment of the present invention, thereby obtaining absolute position data over a single rotation of the encoding plate.

A first channel provided in the rotary encoding plate is formed so that 1 cycle of two-phase sinusoidal wave signals corresponds to a single rotation of the rotary encoding plate. For this purpose, the first channel can be constituted by a predetermined number of slits, each slit width (or length) of which slits changes gradually, or a continuous elongated slit, formed along the periphery (360°) of the rotary encoding plate, thus generating two-phase sinusoidal wave signals which change by one cycle during the single rotation of the rotary encoding plate, based on light passed through the slits of the first channel provided in the rotary encoding plate and each of slits formed in a fixed plate and having a 90°-spatial phase difference therebetween.

A second channel is formed concentrically with the first channel to obtain N cycles (N is an integer equal to or larger than 2) of two-phase sinusoidal wave signals in accordance with the single rotation of the rotary encoding plate (that is, slits of appropriate shape are arranged along the periphery of the rotary encoding plate so as to accomplish an N pitch, and the corresponding slits formed in the fixed plate side are arranged to be shifted therebetween by ¼ of a pitch). In this way, the rotary encoding plate provided with a given number of channels, in each of which channels the number of cycles is gradually increased from each other, is used.

A case will be exemplified by using actual values wherein the above-mentioned rotary encoding plate is used to obtain absolute position data over a single rotation thereof. Note that the rotary encoding plate exemplified herein has first to third channels as the plurality of channels.

The first channel produces 1 cycle of the sinusoidal wave in accordance with the single rotation of the rotary encoding plate, and assume that a value of 552 is obtained as absolute position data (corresponding to $\alpha$) within 1 cycle of the rotary encoding plate at a certain timing, using 1,000 as an interpolating divisor for 1 cycle (which is determined in accordance with the number of bits of an A/D converter) with the method of the present invention.

The second channel produces 200 cycles of sinusoidal waves in accordance with the single rotation of the rotary encoding plate, and assume that a value of 201 is obtained a the absolute position data (corresponding to $\beta$) within 1 cycle. In addition, the third channel produces 2,000 cycles of sinusoidal waves in accordance with the single rotation of the rotary encoding plate, and assume that a value of 10 is obtained as absolute position data within 1 cycle.

First, it is determined which cycle of the second channel corresponds to the absolute position data 552 within 1 cycle of the first channel. For this purpose, since 1 cycle of the second channel corresponds to 5 divisions within 1 cycle of the first channel (1000 divisions/200), the corresponding cycle of the second channel can be obtained by 552/5, and it can be found from the quotient (the remainder is disregarded) that the position data 552 corresponds to the 110th cycle of the second channel.

It also can be found that the 110th cycle of the second channel corresponds to the 1,100th cycle (110 cycles x (2,000/200) of the third channel (having the shortest wavelength).

It is then determined which cycle of the third channel corresponds to the absolute position data 201 within 1 cycle of the second channel. For this purpose, since 1 cycle of the third channel corresponds to 100 divisions within 1 cycle of the second channel (1000 divisions/10), the corresponding cycle of the third channel can be obtained by 201/100, and it can be found from the quotient (the remainder is disregarded) that the position data 201 corresponds to the 2nd cycle of the third channel.

In this way, the rotating position of the rotary encoding plate falls within the range of $(1,100+2) = 1,102$nd cycle of the third channel, and the absolute position data within 1 cycle of the third channel is detected as 10, as described above.

As a result, if an interpolating divisor within 1 cycle of the third channel is also 1000, the rotating position is finally represented by $1,102 \times 1,000 + 10 = 1,102,010$ as the absolute position in the third channel.

In this way, the rotating position over a single rotation of the rotary encoding plate can be obtained as absolute position data with high detection resolution.

According to the present invention, an absolute position of a moving object can be detected with a remarkably higher detection resolution than that obtained in a conventional position detecting method and, based on this, a rotating position of a rotating object over a single rotation thereof can be obtained as absolute position data with high detection resolution.

I claim:
1. A method for detecting a position comprising the steps of:
using a rotary encoding plate having a plurality of channels for generating a two-phase sinusoidal wave signals having a 90°-spatial phase difference therebetween, among which a first channel is formed to obtain 1 cycle of a sinusoidal wave during a single rotation of the rotary encoding plate, a second channel is formed to obtain N cycles of the sinusoidal wave, where N is an integer larger than two, during the single rotation of the rotary encoding plate, and other channels are similarly formed to obtain increased number of cycles of the sinusoidal wave;

producing a plurality of pairs of two-phase sinusoidal wave signals using said rotary encoding plate, said plurality of pairs of two-phase sinusoidal wave signals having a 90°-spatial phase difference therebetween upon movement of a moving object, and each pair having a different wavelength from another pair;

detecting a current voltage values $V_a$ and $V_b$ of the two-phase sinusoidal wave signals of the first channel and calculating the phase angle $\alpha$ of the sinusoidal wave of the first channel, by solving an equation $V_a \cdot \cos\alpha - V_b \cdot \sin\alpha = 0$ where $\alpha$ is a variable, on condition that polarities of $\sin\alpha$ and $\cos\alpha$ for the calculated $\alpha$ coincide with those of $V_a$ and $V_b$, respectively;

detecting a current voltage values $V_c$ and $V_d$ of the two-phase sinusoidal wave signals of the second channel and calculating the phase angle $\beta$ of the sinusoidal wave of the second channel by solving the equation $V_c \cdot \cos\beta - V_d \cdot \sin\beta = 0$ where $\beta$ is a variable, on condition that polarities of $\sin\beta$ and $\cos\beta$ for the calculated $\beta$ coincide with those of $V_c$ and $V_d$, respectively; and detecting a moving position of a moving object by obtaining phase angle over a plurality of cycles of the two-phase signals of the short wavelength from the values of $\alpha$, $\beta$, ... determined as per the preceding steps so that the rotary positions over a single rotation of the rotary encoding plate are detected as absolute position date.

2. A method for detecting a position according to claim 1, characterized in that a rotary encoding plate having a plurality of channels for generating two-phase sinusoidal wave signals having a 90°-spatial phase difference therebetween, among which a first channel is formed to obtain 1 cycle of a sinusoidal wave during a single rotation of the rotary encoding plate, a second channel is formed to obtain N cycles of the sinusoidal wave, where N is an integer larger than two, during the single rotation of the rotary encoding plate, and other channels are similarly formed to obtain increased number of cycles of the sinusoidal wave, is used as means for generating a plurality of pairs of two-phase sinusoidal wave signals having a 90°-spatial phase difference therebetween upon movement of a moving object, and each of which pairs has a different wavelength from each other.

3. a method for detecting a position according to claim 1 further comprising the step of producing the two-phase sinusoidal wave signals of the first channel having a long wavelength and producing the two-phase sinusoidal wave signals of the second channel being a short wavelength.

4. A method of detecting a position, comprising the steps of:

using a rotary encoding plate having a plurality of channels for generating two-phase sinusoidal wave signals having a 90?-spatial phase difference therebetween, among which a first channel is formed to obtain 1 cycle of a sinusoidal wave during a single rotation of the rotary encoding plate, a second channel is formed to obtain N cycles of the sinusoidal wave, where N is an integer larger than two, during the single rotation of the rotary encoding plate, and other chemicals are similarly formed to obtain increased number of cycles of the sinusoidal wave;

producing a plurality of pairs of two-phase sinusoidal wave signals using said rotary encoding plate, said plurality of pairs of two-phase sinusoidal wave signals having a 90?-spatial phase difference therebetween upon movement of a moving object, and each pair of a different wavelength from another pair;

detecting a current voltage values $V_a$ and $V_b$ of the two-phase sinusoidal wave signals of the first channel for a long wavelength and calculating the phase angle $\alpha$ of the sinusoidal wave of the first channel, by solving an equation $V_a \cdot \cos\alpha - V_b \cdot \sin\alpha = 0$ where $\alpha$ is a variable, on condition that polarities of $\sin\alpha$ and $\cos\alpha$ for the calculated $\alpha$ coincide with those of $V_a$ and $V_b$, respectively;

detecting a current voltage values $V_c$ and $V_d$ of the two-phase sinusoidal wave signals of the second channel for a short wavelength and calculating the phase angle $\beta$ of the sinusoidal wave of the second channel by solving the equation $V_c \cdot \cos\beta - V_d \cdot \sin\beta = 0$ where $\beta$ is a variable, on condition that polarities of $\sin\beta$ and $\cos\beta$ for the calculated $\beta$ coincide with those of $V_c$ and $V_d$, respectively; and detecting a moving position of a moving object by obtaining phase angle over a plurality of cycles of the two-phase signals of the short wavelength from the values of $\alpha$, $\beta$, ... determined as per the preceding steps so that the rotary positions over a single rotation of the rotary encoding plates are detected as absolute position date.

5. A method for detecting a position, comprising the steps of:

using a rotary encoding plate having a plurality of channels for generating two-phase sinusoidal wave signals having a 90°-spatial phase difference therebetween, among which a first channel is formed to obtain 1 cycle of a sinusoidal wave during a single rotation of the rotary encoding plate, a second channel is formed to obtain N cycles of the sinusoidal wave, where N is an integer larger than two, during the single rotation of the rotary encoding plate, and other channels are similarly formed to obtain increased number of cycles of the sinusoidal wave;

producing a plurality of pairs of two-phase sinusoidal wave signals using said rotary encoding plate, said plurality of pairs of two-phase sinusoidal wave signals having a 90°-spatial phase difference therebetween upon movement of a moving object, and each pair having a different wavelength from each other;

detecting a current voltage values $V_a$ and $V_b$ of a first pair of two-phase sinusoidal wave signals having the longest wavelength, said first pair of two-phase sinusoidal wave signals being produced from said first channel;

calculating the phase angle $\alpha$ of said pair of sinusoidal wave signals by solving the equation $V_a \cdot \cos\alpha - V_b \cdot \sin\alpha = 0$ where $\alpha$ is a variable, on condition that polarities of sin$\alpha$ and cos$\alpha$ for the calculated $\alpha$ coincide with those of $V_a$ and $V_b$, respectively;

detecting a current voltage values $V_c$ and $V_d$ of a second pair of two-phase sinusoidal wave signals having shorter wavelengths than that of said first pair of two-phase sinusoidal wave signals, said second pair of two-phase sinusoidal wave signals being produced from said second channel;

calculating the phase angle $\beta$ of said second pair of sinusoidal wave signals by solving the equation $V_c \cdot \cos\beta - V_d \cdot \sin\beta = 0$ where $\beta$ is a variable, on condition that polarities of sin$\beta$ and cos$\beta$ for the calculated $\beta$ coincide with those of $V_c$ and $V_d$, respectively;

repeating said detecting step and said calculating step to finally calculate a phase angle of another pair of two-phase sinusoidal wave signals having the shortest wavelengths, said another pair of two-phase sinusoidal wave signals being produced from one of said another channels; and detecting a rotary position over a single rotation of the rotary encoding plate as absolute position data by obtaining a phase angle over a plurality of cycles of the two-phase signals having the shortest wavelength from the values of said phase angles $\alpha$, $\beta$, and so on, each calculated in accordance with the preceding steps.

* * * * *